(12) United States Patent
Yafe

(10) Patent No.: US 8,534,787 B2
(45) Date of Patent: Sep. 17, 2013

(54) METHOD AND SYSTEM FOR PRINTING ON A PRINTED CIRCUIT BOARD

(75) Inventor: Albert Yafe, Raanana (IL)

(73) Assignee: Camtek Ltd., Migdal Haemek (IL)

( * ) Notice: Subject to any disclaimer, the term of this patent is extended or adjusted under 35 U.S.C. 154(b) by 759 days.

(21) Appl. No.: 12/581,931

(22) Filed: Oct. 20, 2009

(65) Prior Publication Data

US 2010/0066786 A1     Mar. 18, 2010

Related U.S. Application Data

(63) Continuation-in-part of application No. 11/907,346, filed on Oct. 11, 2007, now abandoned.

(51) Int. Cl.
   *B41J 29/38* (2006.01)

(52) U.S. Cl.
   USPC .......... 347/12

(58) Field of Classification Search
   USPC .............. 347/12, 40, 43, 4, 41, 102
   See application file for complete search history.

(56) References Cited

U.S. PATENT DOCUMENTS

| | | | |
|---|---|---|---|
| 5,581,284 A * | 12/1996 | Hermanson | 347/43 |
| 6,754,551 B1 * | 6/2004 | Zohar et al. | 700/121 |
| 2005/0176177 A1 | 8/2005 | Zohar et al. | |
| 2007/0188549 A1 * | 8/2007 | Silverbrook | 347/40 |

* cited by examiner

*Primary Examiner* — Lamson Nguyen
(74) *Attorney, Agent, or Firm* — Oren Reches

(57) ABSTRACT

A method, a printing system and a printing bridge. The printing bridge is configured to accommodate in a precise manner a jet print head. The jet print head includes first jet nozzles for injecting a first type jettable substance to form a first pattern onto the surface of a object, and a second jet nozzles for injecting a second type of jettable substance to form a first pattern onto the surface of a object. The first type jettable substance is utilized for printing a solder mask pattern and the second type jettable substance is utilized for printing a legend pattern.

15 Claims, 13 Drawing Sheets

METHOD AND SYSTEM FOR PRINTING ON A PRINTED CIRCUIT BOARD

RELATED APPLICATIONS

This application is a continuation in part of U.S. patent application Ser. No. 11/907,346 titled "Method and apparatus for PCB finishing processes", filing date Oct. 11, 2007 now abandoned.

FIELD OF THE INVENTION

The present invention relates to an apparatus combining various elements in the PCB finishing processes and a method for combining steps in the digital manufacturing of printed circuit boards (PCB) using inkjet printers.

BACKGROUND OF THE INVENTION

The printed circuit board (PCB) or printed wiring board (PWB) is the object that connects and interfaces most electronic components with each other and with other elements in computers, communication devices, consumer electronics, automated manufacturing and inspection equipment.

The procedures of manufacturing these circuit boards and of inserting and connecting multiple components, such as resistors, capacitors and integrated circuits, can be applied in mass production environments, achieving substantial automation, which results in costs reduction, high reliability and high component packaging densities. Backplanes and panels (interconnecting boards, in which printed circuits, panels or integrated circuit packages can be plugged or mounted into or onto) are also manufactured in a similar manner. Modern, highly-dense, populated boards require sophisticated and high resolution manufacturing techniques with precise registration capabilities.

A PCB is produced from a base of insulating material on which a thin copper layer is laminated or plated, known as a bare copper plated board, from which a chemical etching step selectively removes areas of the copper to produce electrically conducting paths. This selective removal is achieved by covering the copper layer with a patterned mask (etch-resist) that protects the copper layer in the following etching step. For simpler PCBs, screen-printing techniques are generally utilized to form the patterned mask, and for more densely populated PCBs having generally complicated multi-layer conducting paths, Liquid Photo Imageable etch and solder resist mask procedures are commonly utilized. The pattern that remains on the board after the etching step is commonly known as the primary image conductor pattern.

The components leads must then be connected to predetermined positions in the conducting paths (called pads) by soldering the leads and the conducting paths utilizing a molten metal alloy, which, after solidifying, achieves a permanent electrically conductive bond. In mass production, wave-soldering methods are commonly utilized, wherein the PCB passes through a molten solder wave that coats the pads and leads and thus forms the required solder joints. A solder resist mask protects the conducting paths from being coated with solder during the soldering step. The solder resist mask leaves uncovered only the pads that need to be covered by the molten solder; otherwise, the conducting paths would also be covered with solder, causing several problems such as short circuits by bridging solder.

Various finishing processes in the manufacturing of PCBs currently use (or will be able to use shortly) state of the art inkjet printers. These printers are used to deposit specific kinds of material on the surface of the PCB according to computer generated graphics.

In one application, an inkjet printer may be used to cover the PCB with a material that acts as a solder mask in the ensuing manufacturing processes and acts as a protective cover layer throughout the life of the finished electronics subsystem. This solder mask may be applied using any conventional method such as "curtain coating" and "silkscreen" methods.

The solder mask coating may also be applied digitally, as described, for example, in U.S. Patent Application Publication No. 2005/0176177 (Zohar et al), the disclosures of which are incorporated herein in their entireties, and which disclose a method and apparatus for applying ink, according to a solder mask pattern, to a printed circuit board having elevated pads defining pad edges. The method includes flooding the printed circuit board with ink such that the ink advances to the pad edges and is stopped thereby and thereat, without climbing onto the elevated pads.

In another application, inkjet printers deposit notation ink to print human or machine readable information such as legend, 1D or 2D Barcode, geometry defining lines, etc. See, for example, U.S. Pat. No. 6,754,551 (Zohar et al.), the disclosure of which is incorporated herein in its entirety, and which describes a jet dispensing print system for dispensing a liquid or viscous substance as a pattern onto the surface of a PCB in an industrial manufacturing PCB production line.

There is a growing need to speed up the manufacturing process of PCBs, to reduce the footprint of PCB manufacturing tools and to reduce the cost associated with the manufacturing of PCSs.

SUMMARY OF THE INVENTION

It is one object of the present invention to provide a system wherein solder masks and printed legends can be applied to a PCB contemporaneously and using the same apparatus.

Another object of the present invention is to combine two or more material deposition processes and steps into a single machine using inkjet technology.

In accordance with these and other objects of the invention, the deposition of solder mask and the deposition of notation ink are combined within a single machine performing both processes. The combination of these two steps reduces board handling and improves accuracy of deposition as well as reliability. Curing can be combined for the two steps and be performed at once, thus saving valuable time.

In one embodiment, the invention comprises a common PCB handling system, two separate printing and ink supply systems, and one common ink drying subsystem.

Further embodiments of the invention comprise either of the above configurations followed by a curing substation. Still further embodiments of the invention comprise either of the above embodiments and a flipping station for 2-sided printing. Even further embodiments of the invention comprise either of the above embodiments and a loading/unloading station.

One point of innovation in this invention is in the combination of more than one of the material deposition processes and steps into a single machine using inkjet technology.

The materials supply, printing subsystems and drying mechanisms need not be identical. The materials may vary in their printing and/or drying characteristics (such as UV or thermal). The printing resolution need not be identical. The thickness of the deposited material need not be identical.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may be best understood by reference to the following detailed description when read with the accompanied drawings in which:

DETAILED DESCRIPTION OF THE INVENTION

In the following detailed description, numerous specific details are set forth in order to provide a thorough understanding of the invention. For convenience of explanation, the invention is described below with reference to preferred embodiments, which comprise a legend printing and a solder mask printing system. However, it will be understood by those of ordinary skill in the art that the present invention may be practiced without these specific details. For example, those versed in the art will readily appreciate that the invention is by no means bound to these embodiments and various dispensing methods for, inter alia, primary image conducting patterns, etch resist mask patterns, temporary masks, edging non-uniformity compensation control masks, selective conformal coatings, chip-on-board encapsulation, liquid encapsulates, bar codes, and adhesives in surface mount technology (SMT), are within the scope of the present invention. Furthermore, applying certain minor modifications, the present invention is equally suitable for SMT solder paste printing applications. In other instances, well-known methods, procedures, components and circuits have not been described in detail so as not to obscure the present invention.

The terms "curing" and "drying" can have the same meaning throughout this specification depending upon the context. Thus, a curing stage may be a drying stage or may at least include a drying stage and vice verse.

Figure 1:
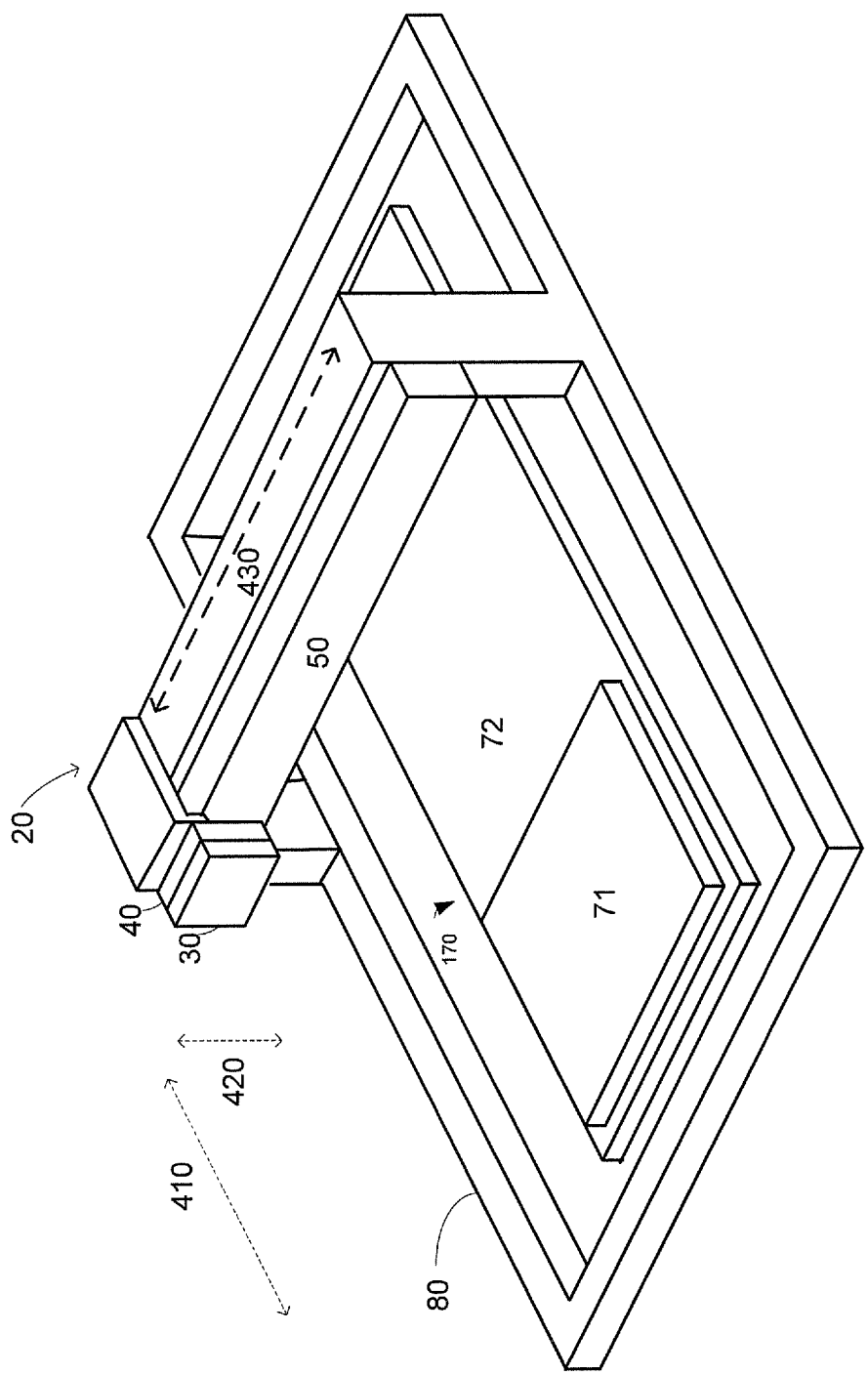
FIG. 1 illustrates a first portion of a printing system according to an embodiment of the invention.

FIG. 1 illustrates a first portion 11 of a printing system according to an embodiment of the invention.

First portion 11 includes printing bridge 20, frame 80, jet print head 30, first and second jet print head motors 40 and 50, and PCB handling sub-system 70.

Object handling sub-system 70 includes an object supporter 71 that supports an object and may firmly hold it after the objects is being aligned and positioned in a desired location and orientation. Object handling sub-system 70 also includes a motorized system 72 that may move object supporter 71 (and object) along first direction 410. First jet print head motor 40 moves jet print head 30 along second direction 420. Second jet print head motor 50 moves jet print head 30 along a longitudinal axis 430 of printing bridge 20. An object (not shown) is placed on object supporter 71. It is noted that motorized system 72 can be held by (or be supported by) a part (not shown) of frame 80.

FIG. 1 illustrates first direction 410, second direction 420 and longitudinal axis 430 as being perpendicular to each other. It is noted that these directions (and axis) may be oriented to each other by less than (or more than) 90 degrees.

Printing bridge 20 is fixed to frame 80 and rigid. Frame 80 is located in a horizontal plane and has a rectangular shape. It is noted that frame may have other shapes and may be oriented in relation to the horizon.

Printing bridge 20 provides a highly accurate and stable structure the does not move during the printed process and simplifies the control scheme of the printing process. The fixed and rigid printing bridge 20 does not include extensive moving parts and its maintenance is simple and cheap. Printing bridge 20 includes a horizontal structural element (that defines its longitudinal axis 430) and two vertical structural elements that define a space in which an object may move.

Printing bridge 20 is configured to accommodate in a precise manner jet print head 30. Jet print head 30 includes first jet nozzles 31 for injecting a first type jettable substance to form a first pattern onto the surface of an object, and includes second jet nozzles 32 for injecting a second type of jettable substance to form a first pattern onto the surface of a object. The first type jettable substance is utilized for printing a solder mask pattern. The second type jettable substance is utilized for printing a legend pattern. Each of the jettable substances may be a fluid, a wet powder and the like.

The number of first jet nozzles 31, and consequently the resolution, need not be the same as that of the number of second jet nozzles. Similarly, the thickness of the deposited material may vary.

The first and second jet nozzles may be arranged in various manners. For example, first jet nozzles (denoted 31 in FIGS. 12 and 13) may be spaced apart from second jet nozzles denoted 32 in FIGS. 12 and 13). Each of these jet nozzles may be arranged to form one or more array, one or more rows, one or more columns and the like. The array may have a rectangular shape, a diamond like shape, a rectangular shape, a circular shape and the like. The spaced apart configuration may assist in preventing one type of jettable substance to be mixed with the second type of jettable substance. This may also simplify the provision of the different jettable substances to different jet nozzles.

Yet for another example, first jet nozzles 31 and second jet nozzles may be arranged in an interlaced manner. Both jet nozzles may form an array and different rows or columns may include different jet nozzles. Alternatively, the same row or column may include both first jet nozzles and second jet nozzles.

Figure 12:
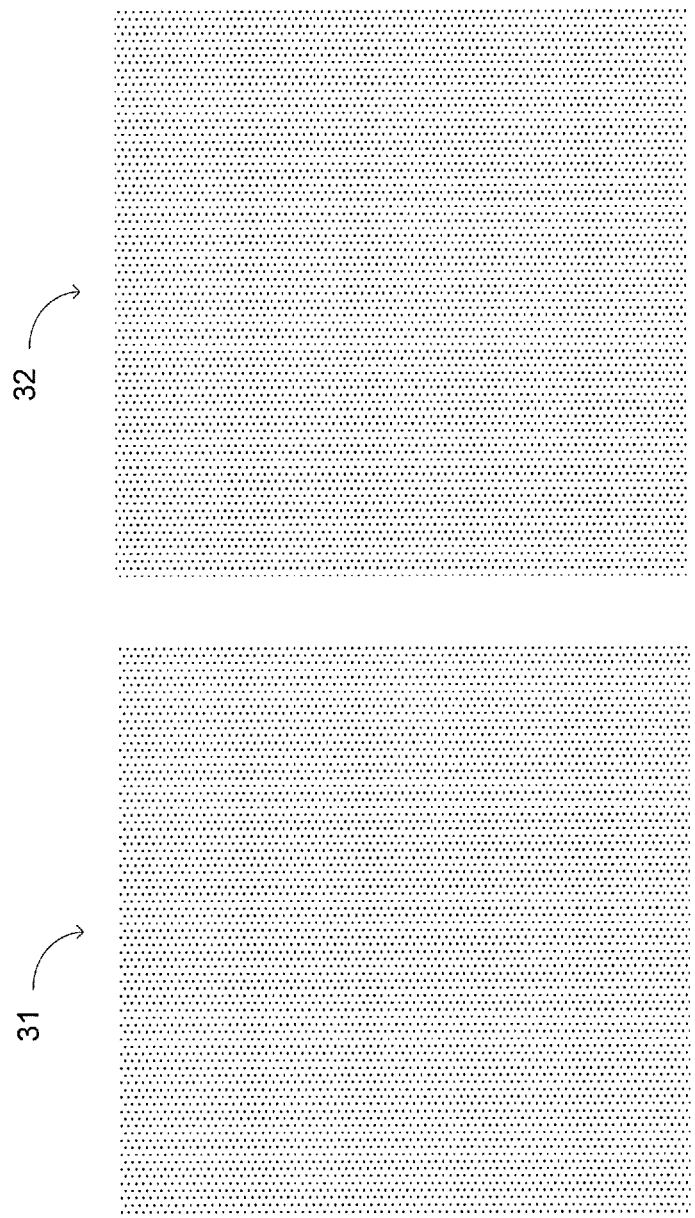
FIG. 12 illustrates a spaced apart configuration of jet nozzles according to an embodiment of the invention.
Figure 13:
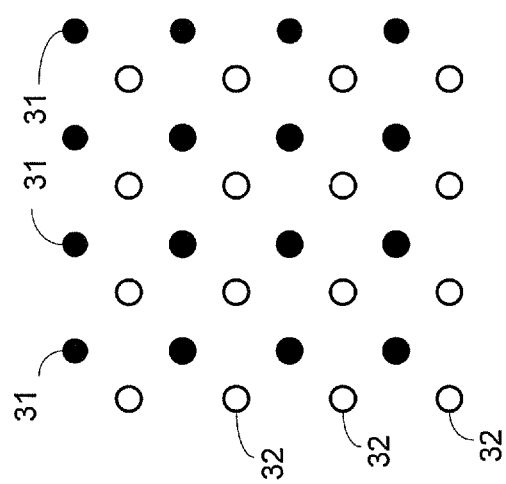
FIG. 13 illustrates an interlaced configuration of jet nozzles according to an embodiment of the invention.

FIG. 12 illustrates an example of spaced apart configuration of jet nozzles and FIG. 13 illustrates an example of an interlaced configuration of jet nozzles according to various embodiments of the invention.

The same jet nozzles can be used to inject the first jettable substance and to inject the second jettable substance. Thus, at a first point in time a jet nozzle can be regarded as a first jet nozzle and at another point in time it can be regarded as a second jet nozzle. This may be achieved depending on the physical characteristics of the solder mask and legend inks and the efficiency concerns of the PCB mass production process. However, in such a configuration, an intermediate purging/cleaning step may be required in order to change printing inks between Solder Mask printing and Legend Ink printing.

The printing bridge 20 may also include (or be connected to) a jet print head motor for moving jet print head 30 in relation to the printing bridge 20. FIG. 1 illustrates first jet print head motor 40 that moves the jet print head 30 along a second direction, an object handling sub-system 70 that moves the object (not shown) along a first direction and a second jet print head motor 50 that moves the jet print head along longitudinal axis 430 of printing bridge 20. FIG. 1 illustrates the first direction, the second direction and the longitudinal axis as being perpendicular to each other. It is noted that these directions (and axis) may be oriented to each other by less than (or more than) 90 degrees.

According to an embodiment of the invention a part of the first jet nozzles and a part of the second jet nozzles are utilized as back-up nozzles. Thus, redundant nozzles are added, as illustrated, for example, in U.S. Pat. No. 6,754,551 of Zohar et al, which is incorporated herein. Dedicated rows may include back-up nozzles. Dedicated columns may include back-up jet nozzles. Yet according to another embodiment of the invention backup jet nozzles and non-backup jet nozzles can be arranged in an interlaced manner.

Figure 2:
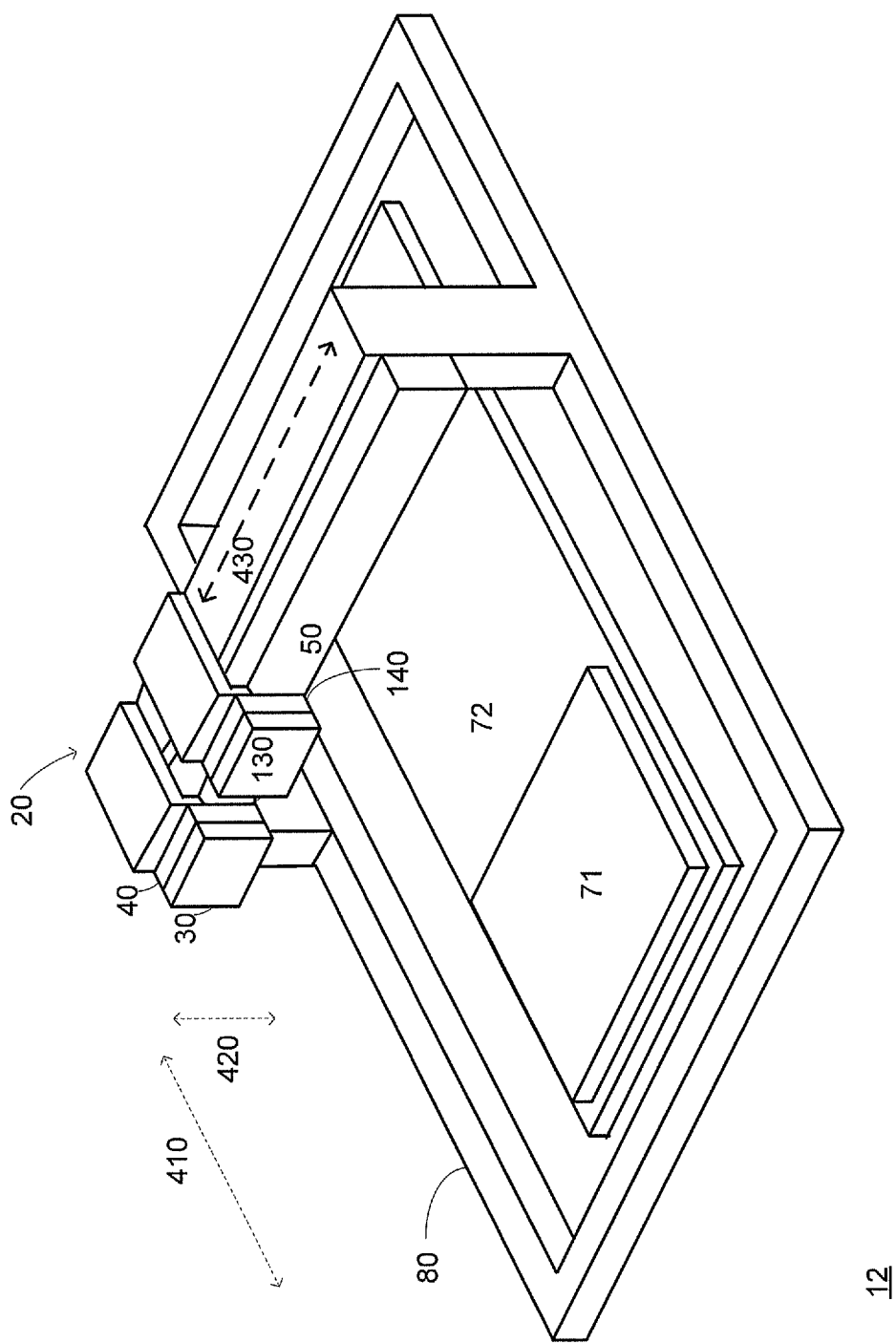
FIG. 2 illustrates a first portion of a printing system according to an embodiment of the invention.

FIG. 2 illustrates a first portion 12 of a printing system according to an embodiment of the invention.

First portion 12 includes printing bridge 20, frame 80, first jet print head 30, second jet print head 130, first jet print head motor 40, second jet print head motor 50, third jet print head motor 140 and PCB handling sub-system.

First portion 12 of FIG. 2 differs from first portion 11 of FIG. 1 by including two jet print heads (30 and 130) instead of a single jet print head (30) and by including three jet print head motors (40, 50 and 140) instead of a pair of jet print head motors (40 and 50).

Each jet print head (out of 30 and 130) can include first and second jet nozzles. Alternatively, each jet print head includes jet nozzles for printing a single jettable substance. For example, first jet print head 30 includes first jet nozzles 31 while second jet print head 130 includes second jet nozzles 32.

Each jet print head can be controlled independently from the other jet print head. Both jet print heads can be activated in parallel to each other. For example—one jet print head can print a legend pattern while the other may print a solder mask pattern. Yet for another example, each jet print head can be moved (along printing bridge 20 by second and fourth jet print head motors 50 and 150) to a different location thus allowing to print different patterns at different locations on object 100 substantially simultaneously. This increases the throughput of the system.

Figure 3:
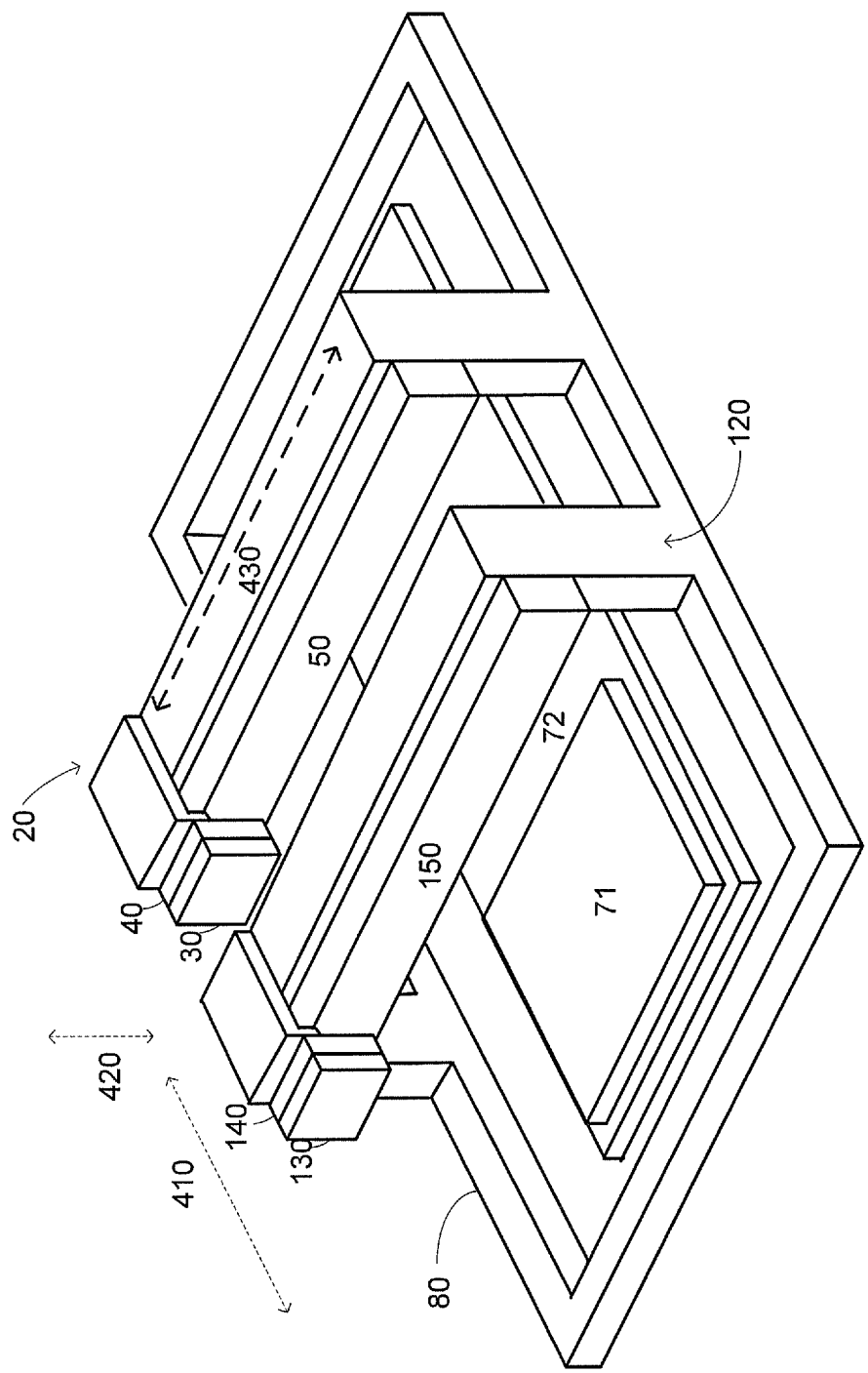
FIG. 3 illustrates a first portion of a printing system according to an embodiment of the invention.

FIG. 3 illustrates a first portion 13 of a printing system 100 according to an embodiment of the invention.

First portion 13 includes first printing bridge 20, second printing bridge 120, frame 80, first jet print head 30, second jet print head 130, first jet print head motor 40, second jet print head motor 50, third jet print head motor 140, fourth jet print head motor 150 and PCB handling sub-system.

First portion 13 of FIG. 3 differs from first portion 12 of FIG. 2 by including two bridges (20 and 120) instead of a printing bridge (20).

This configuration allows printing first and second patterns that are spaced apart from each other not only along the longitudinal axis 430 of first bridge but also along first direction.

According to an embodiment of the invention a curing device (not shown) is located between the bridges and it allows performing a curing process between the printing of a legend pattern and the printing of a solder mask pattern. The curing device may apply heat, UV radiation and the like.

Figure 4:
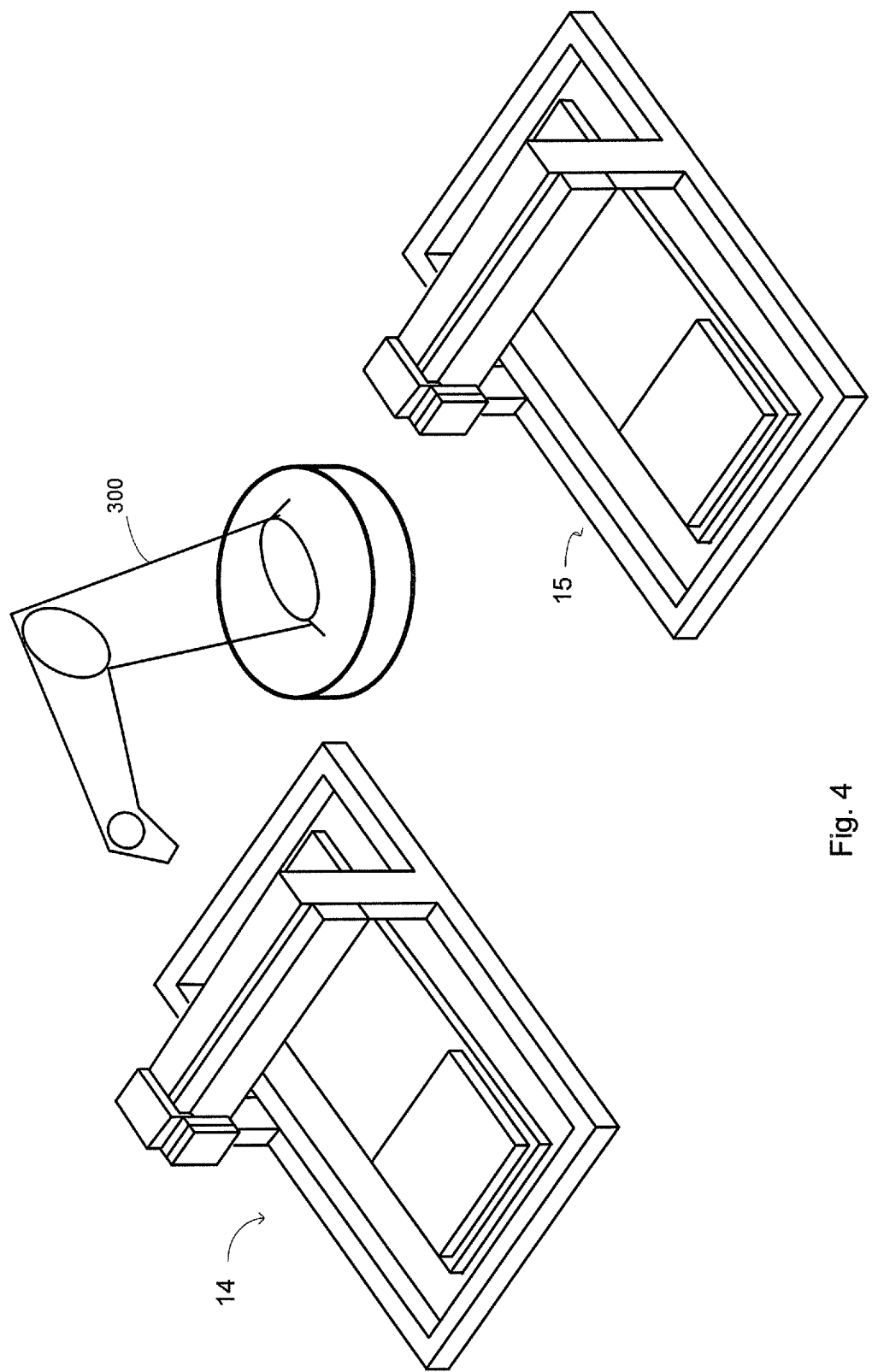
FIG. 4 illustrates two first portions of a printing system and a loading/unloading mechanism according to an embodiment of the invention.

FIG. 4 illustrates two first portions 14 and 15 and loading/unloading mechanism 300 according to an embodiment of the invention.

Loading/unloading mechanism 300 is positioned such as to feed an object to either one of first portions 14 and 15. It may also move the object to one or more drying mechanisms.

First portion 14 includes printing bridge 20, frame 80, first jet print head 301, first and second jet print head motors 40 and 50, and PCB handling sub-system. First portion 14 includes printing bridge 20, frame 80, second jet print head 302, first and second jet print head motors 40 and 50, and PCB handling sub-system.

First jet printing head 301 may include first jet nozzles 31, second jet nozzles 32 or a combination thereof. Second jet printing head 302 may include first jet nozzles 31, second jet nozzles 32 or a combination thereof. A pattern or pattern may be printed by first portion 14 and then provided to first portion 15 for printing another pattern and vice verse.

According to an embodiment of the invention patterns may be printed on more than a single object in parallel. The multiple objects can be placed beneath printing bridge 20 and may be moved by one or multiple motorized systems. Each of the mentioned above first portions may print patterns on different objects that are accessible to their one or more jet print heads. Different patterns may be printed on different objects in parallel, in a partially overlapping manner or in a non-overlapping manner.

Figure 5:
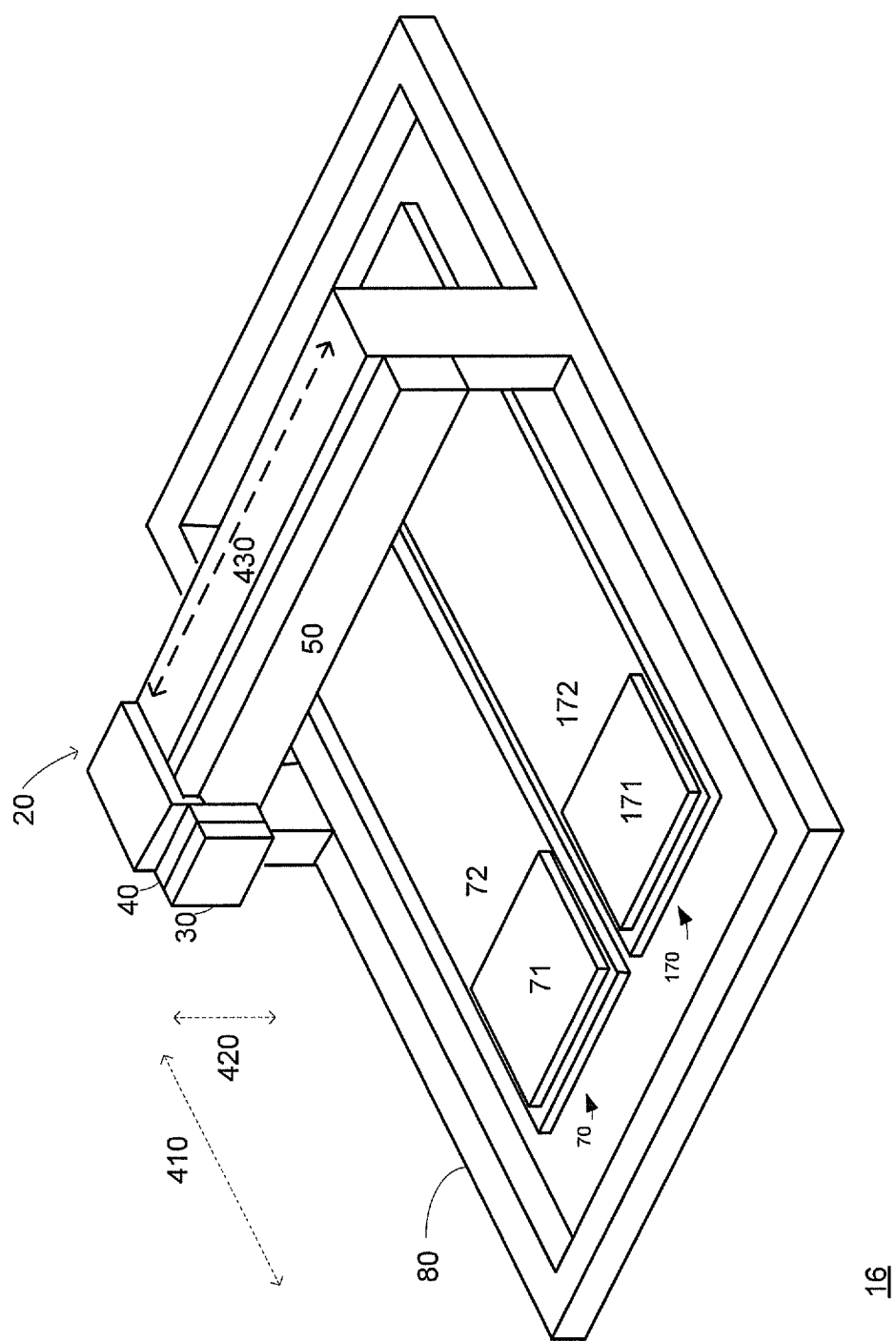
FIG. 5 illustrates a first portion of a printing system according to an embodiment of the invention.

FIG. 5 illustrates a first portion 16 of a printing system according to an embodiment of the invention.

First portion 16 of FIG. 5 differs from first portion 11 of FIG. 1 by including a pair of object handling sub-systems (70 and 170) instead of a single object handling sub-system (70). Each object handling sub-system may support and move a different object.

It is noted that a single object handling sub-system (such as 70) can support and move two or more objects and not only a single one. It is further noted that any of first portions 11, 12, 13 or 14 may includes an object handling sub-system that may support and move more than a single object.

Figure 6:
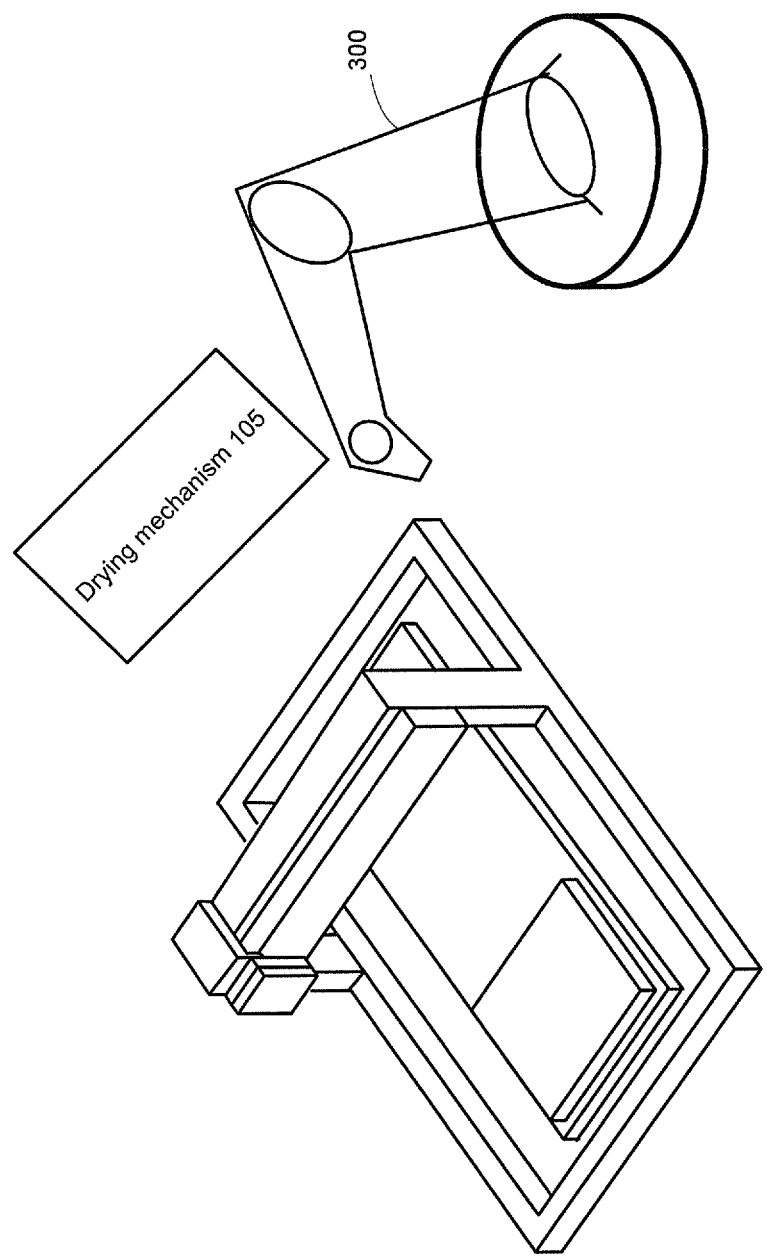
FIG. 6 illustrates various components of a system according to an embodiment of the invention.

FIG. 6 illustrates various components of system 506 according to an embodiment of the invention.

System 506 includes loading/unloading mechanism 300, drying mechanism 105 and a first portion such as first portion 11, 12, 13, 14 or 15.

Figure 9:
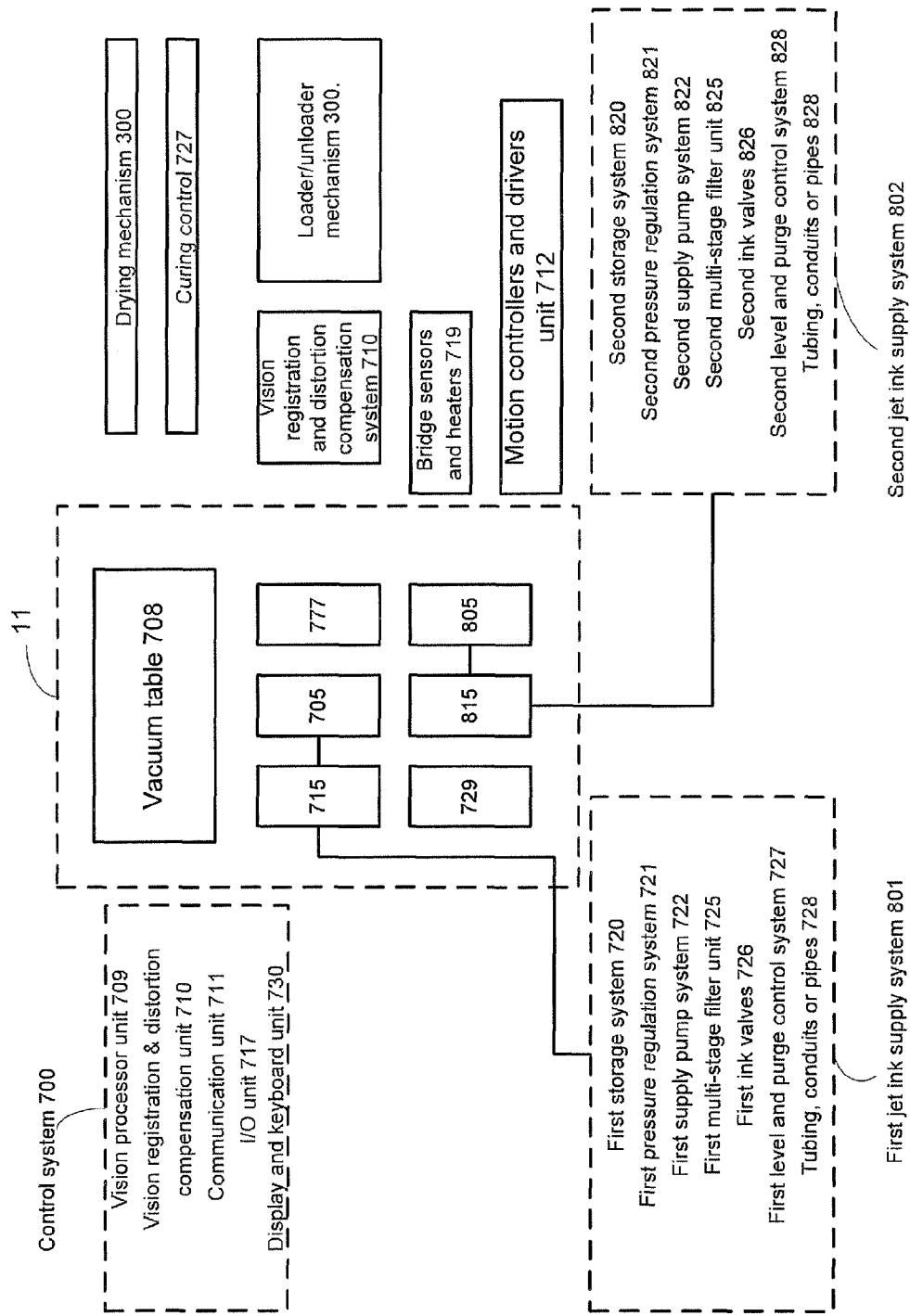
FIG. 9 illustrates various components of a system according to an embodiment of the invention.

System 506 also includes various other components (such as jet ink supply systems, control systems and the like) that are not shown for simplicity of explanation. Some of these components are shown in FIG. 9.

Loading/unloading mechanism 300 is the primary mechanism through which PCBs enter or exit system 506. Loading/unloading mechanism 300 may employ any technique known the mass production arts including, but not limited to, conveyer belts, slot loading mechanisms, magazine-loading mechanisms, vertical buffering, manual placement, etc. Either PCBs may be manually inserted into and removed from system 506, or the loading/unloading process may be automated to convey PCBs from previous and/or subsequent steps in the PCB manufacturing process.

Once the PCB is loaded into system 506, the position, orientation and movement of the PCB within system 506 is controlled by object handling sub-system 70. The object handling sub-system 70 may move the PCB from first portion 11 to drying mechanism 105. It is noted that the drying mechanism 105 may be located within frame 80, be a part of first portion 11, located in proximity to frame 80, and the like.

The object handling sub-system 70 may employ techniques such as conveyor belts, servo motors or any other technique known in the art of PCB manufacturing. Accuracy of PCB placement may be confirmed by computer controlled optical cameras, using computer vision techniques known in the mass production arts. Object handling sub-system 70 may also include a vacuum based handling apparatus, similar to that employed in wafer processing, in which the underside of the PCB is held in place by a vacuum seal to minimize PCB movement and enhance precision printing. PCB clamps, which are brought to position either manually or automatically, may be used either in conjunction with the vacuum based handling apparatus, or by itself. Alternatively, object handling sub-system 70 may be stationary while frame 80 and bridge 120 are moved. Alternatively, object handling sub-system 70 moves the object along one direction while movement along other directions is done by other motors.

Object handling sub-system 70 may also be equipped with a debris cleaning system, employing a turbofan, particle collection trap, vacuums and/or a series of brushes.

Drying mechanism 105 may employ either thermal or UV ink drying techniques, or both, as is well known in the inkjet printing art, depending upon the needs and characteristics of the solder mask and notation ink. Both thermal and UV drying techniques may also be employed simultaneously or sequentially, thereby saving considerable time and expense of having multiple drying subsystems corresponding to the various ink types employed by the apparatus. Other embodiments of the drying mechanism 105 may allow concurrency in the drying process. For instance, one might coat the PCBs with solder mask and legend materials that could be sensitive to different wavelengths, expose solder mask with one wavelength and legend with another wavelength.

It is noted that drying mechanism may be located near frame 80—below or above the plane of frame 80 and the like. Moving system 71 cam move the object to drying mechanism 105 without the aid of loading/unloading mechanism 300.

Figure 7:
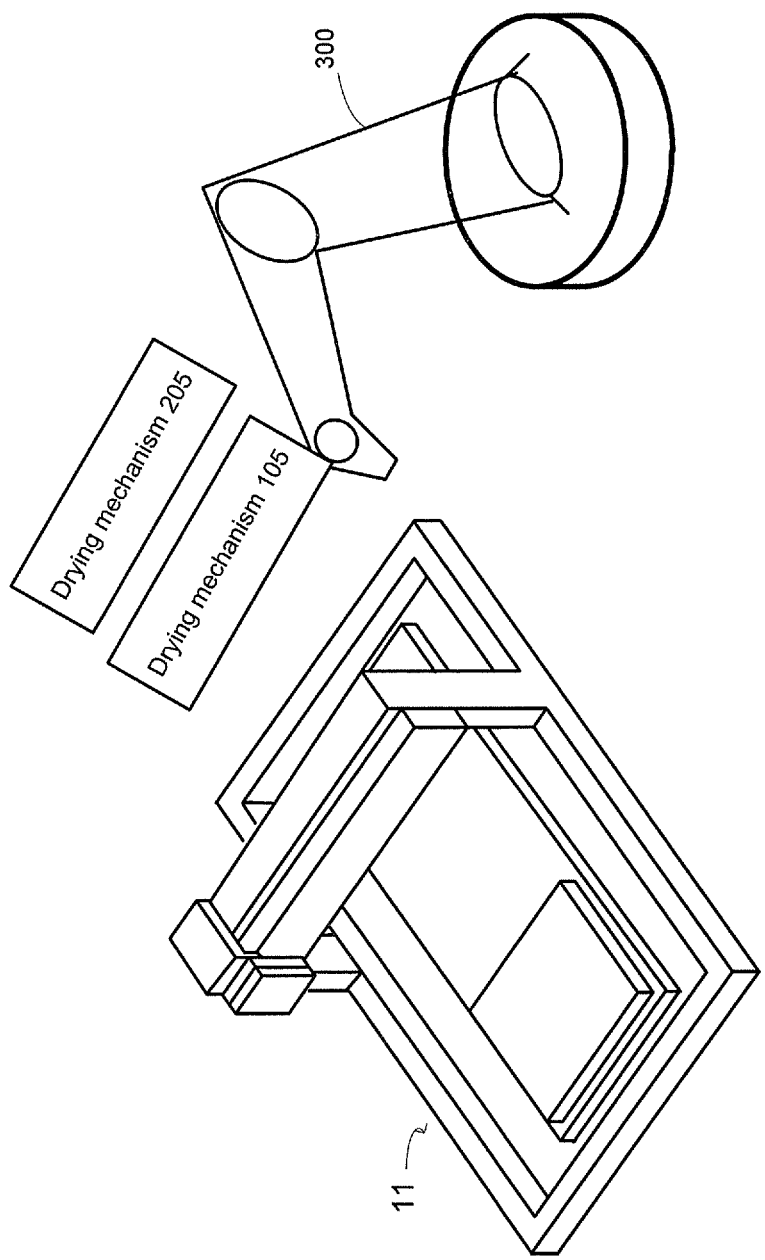
FIG. 7 illustrates various components of a system according to an embodiment of the invention.

FIG. 7 illustrates various components of system 507 according to an embodiment of the invention.

System 507 of FIG. 7 differs from system 506 of FIG. 6 by including two drying mechanisms 105 and 205. First drying mechanism 105 is used during solder mask pattern printing while second drying mechanism 205 is used during legend pattern printing. This configuration may provide easier upgradeability for damaged or outdated drying mechanisms, and may prove less costly than employing an integrated drying unit for both solder ink and notation ink. Separate drying mechanisms also allow for individualized characteristics for each drying step, such as UV or thermal drying, as well as individualized temperature and duration settings.

Figure 8:
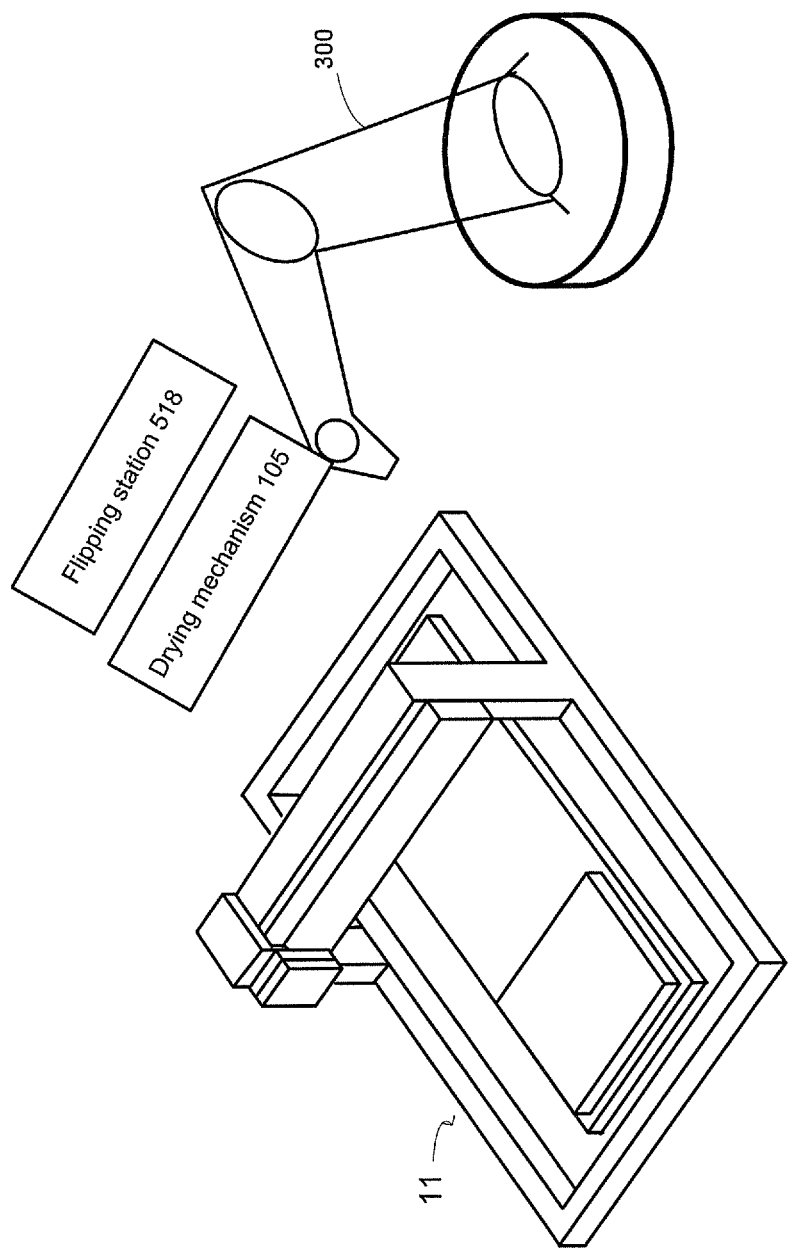
FIG. 8 illustrates various components of a system according to an embodiment of the invention.

FIG. 8 illustrates various components of system 508 according to an embodiment of the invention. System 508 of FIG. 8 differs from system 506 of FIG. 6 by including a flipping station 518 that may flip the object and thus allows patterns to be printed on one side of object and then be printed (after being flipped) on the other side of the object.

System 508 also includes various other components (such as jet ink supply systems, control systems and the like) that are not shown for simplicity of explanation. Some of these components are shown in FIG. 9.

FIG. 9 illustrates various components of system 509 according to an embodiment of the invention.

FIG. 9 illustrates control system 700, first portion 12, motion controllers 712, vision registration and distortion compensation system 710, an object holder such as vacuum table 708, bridge sensors and heaters 719, illumination station 777 that may illuminate an object while being printed upon, drying mechanism 300 (also known as curing station), curing control 727 that controls the curing process, first jet nozzle drivers 715, second jet nozzles drivers 815, first jet nozzles 705, second jet nozzles 805 and first and second jet ink supply systems 702 and 802.

It is noted that system 509 can include any first portion out of first portions 11, 12, 13, 14 and 15. If it includes a single jet print head then a single het print head is provided but it may include separate drivers to second jet nozzles and first jet nozzles.

Control system 700 can include one or more controllers, processor, micro-controllers, and the like. It may include a man machine interface for receiving commands, providing status, displaying images of objects and the like.

Control system 700 may be configured to perform at least one of the following operations: (i) convert pattern information to commands that activate jet nozzles, (ii) perform image processing of images obtained during the printing process, (iii) receive image and status information during the printing process, (iv) manage malfunctions by activating backup jet nozzles, changing the timing of ink jet operations (amend firing times of jet nozzles), (v) control the movement motors such as jet print head motors (40, 50, 140 and 150), object handling sub-system 70, (vi) control a provision of jettable substrates to the jet nozzles.

Control system 700 may include one or more card cages to accommodate various electronic cards and provide supply voltages and data paths to and from these cards. It may include an image processing system that may include software modules, hardware modules or a combination thereof. It may convert commonly supported image file formats such as PDL (Page Description Language), postscript or other vector-type of graphic files into a pixel-mapped page image, which is in effect the actual print data that is transferred to the printer to print a pattern, representing the image of the data file. A widely used file format is e.g. the Gerber or extended Gerber format. Converted print data may be provided via a data path and synchronizing board of control system and be transferred to first jet print head drivers 705 and second jet print head drivers 805. This converted print data may be provided from the drivers to the multiple jet nozzles, situated on the static and rigid printing bridge 20 (or bridges 20 and 120). The Synchronizing board 704 provides the means of synchronizing the data timing with the vacuum table 708 movement.

Optionally, control system 700 includes a vision system, including vision processor unit 709 and vision registration & distortion compensation unit 710, which is employed for various tasks, in particular for solder mask printing, further below described in more detail.

Optionally, control system 700 includes a communication unit 711 for providing data into motion controller and drivers unit 712, which transforms the electrical positional signals, representative of the positional data, into electric control signals, commonly pulses that operate the object handling sub-system 70, first print jet head motor 40 and second print jet motor 50. Object handling sub-system 70 may include a motor and a vacuum table denoted 708 in FIG. 8.

Optionally, system 700 includes one or more additional motors (not shown) that may change the vertical distance between vacuum table 700 and printing bridge 20. These additional motors may also be controlled by vertical positional control signals from motion controller and drivers unit 712. This vertical movement may assist in compensating for thickness differences between different objects.

I/O unit 717 of control system 700 communicates with the various components of system 800, such as inter alia, bridge sensors & heaters & system heaters 719 and loader/unloader 720.

I/O unit 717 may also communicate with various components of the system such as valves (not shown) that control the vacuum level at different locations of vacuum table. This allows a reduction of the vacuum level in areas that are proximate to jettable substance that was jetted on the object and was not cured. These valves may achieve area addressable suction force in vacuum table 708, as illustrated in U.S. Pat. No. 6,754,551 of Zohar which is incorporated herein by reference. These values form a part of area-addressable suction force valve system 718 that provides different vacuum levels to different parts of vacuum table 708.

Either one of the first and second jettable substances may include as a one-pack epoxy based, heat curable jettable substance or ink, with suitable additives. Thus, the composition of suitable inks contains inter alia, a curable binder, optionally solvents, pigments, dyes, fillers and other functional materials. The binder is a resin combined with other components, which enable curing of the ink after contact with the substrate. The resin can be cured, or heat cured or cured by a combination of several curing mechanisms. Such resins can be based on, but not limited to: melamine, epoxy, or acrylate chemistry. It should be noted here that the term binder is used here as a component, which has the ability to adhere on a substrate, and optionally, to bind several components to the substrate. For legend printing, a white or yellow pigment is utilized, whilst for solder mask printing a green dye is utilized.

The first jet nozzles may receive the first jettable substance from first jet ink supply system 801 while the second jet nozzles may receive the second jettable substance from second jet ink supply system 802.

First jet ink supply system 801 includes: (i) a first storage system 720 that may include one or more containers, including a main container and a secondary container that functions as a level controlling system by applying gravity and physic's principal of communicating vessels, thus controlling the negative meniscus pressure; (ii) a first pressure regulation system 721, utilizing above-mentioned principal of communicating vessels; (iii) a first supply pump system 722, controlled by control system 700, (iv) a first multi-stage filter unit 725, controlling maximum particle size of ink substance, (v) multiple first ink valves 726; (vi) a first level and purge control system 727 with a multitude of level sensing devices; (vii) a first wiping, solvent washing, purging and priming unit (not shown); (viii) a first fluid collection vessel, collecting ink and cleaning fluids (not shown); (ix) a first air bubbles drainage system (not shown); (x) a first temperature control system (not shown), that may include a first heating unit, a first temperature sensing unit and a first temperature control unit, (xi) tubing, conduits or pipes 728 for supplying the first jettable substance to first jet print head 30.

Second jet ink supply system 801 includes: (i) a second storage system 820 that may include one or more containers, including a main container and a secondary container that functions as a level controlling system by applying gravity and physic's principal of communicating vessels, thus controlling the negative meniscus pressure; (ii) a second pressure regulation system 821, utilizing above-mentioned principal of communicating vessels; (iii) a second supply pump system 822, (iv) a second multi-stage filter unit 825, controlling maximum particle size of ink substance, (v) multiple second ink valves 826; (vi) a second level and purge control system 828 with a multitude of level sensing devices; (vii) a second wiping, solvent washing, purging and priming unit (not shown); (viii) a second fluid collection vessel, collecting ink and cleaning fluids (not shown); (ix) a second air bubbles drainage system (not shown); (x) a second temperature control system (not shown), that may include a second heating unit, a second temperature sensing unit and a second temperature control unit, (xi) tubing, conduits or pipes 828 for supplying the second jettable substance to second jet print head 130.

Subsequent initial curing (making the dispensed image substantially tack-free), or optionally, complete curing, is achieved in curing system 729, wherein accordingly to the utilized ink type, either thermal, IR (infra-red) oven or curing by UV (ultra-violet) exposure is applied.

Various operator related interactions with the system are performed utilizing a display and keyboard unit 730 of control system 700.

Figure 10:
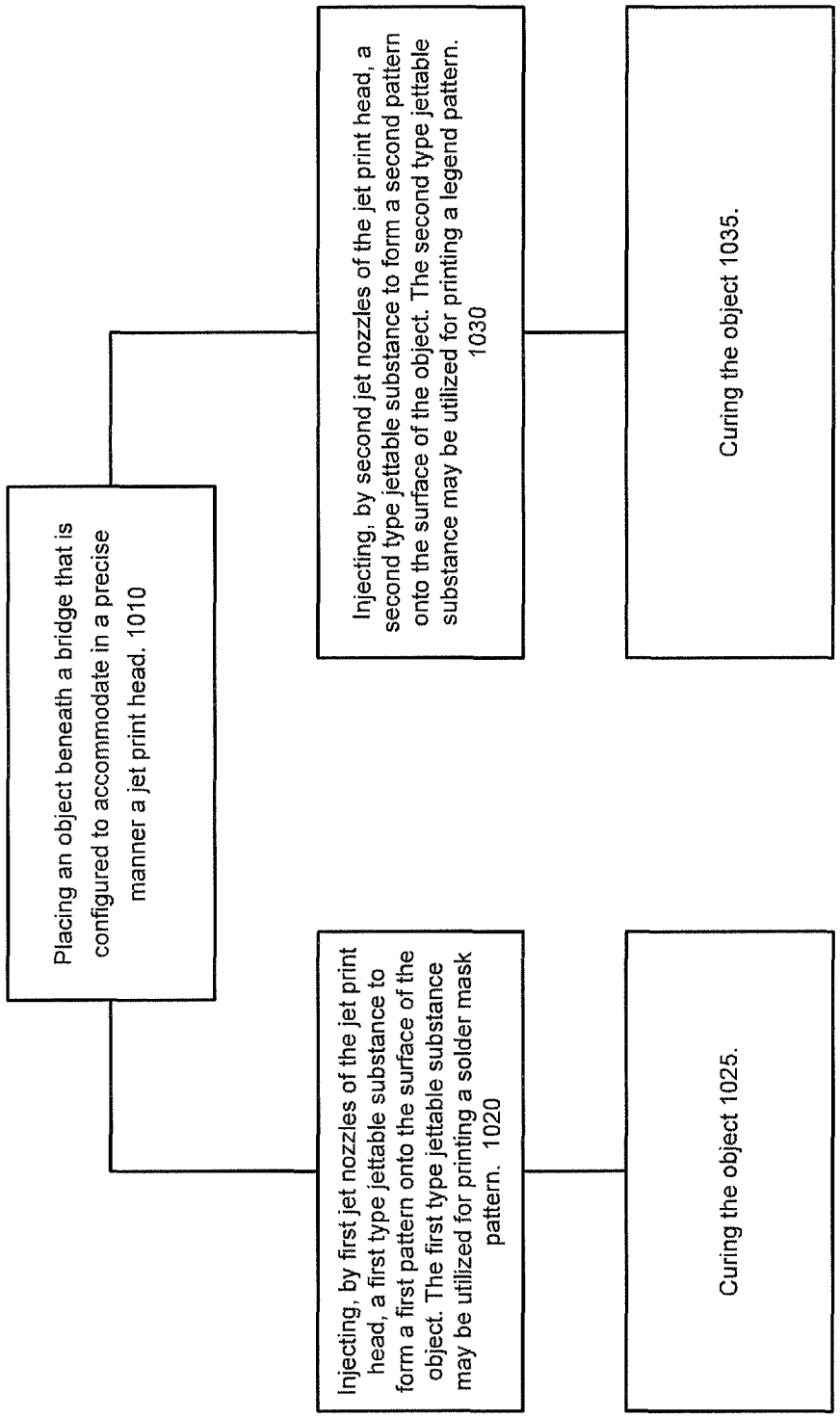
FIG. 10 is a flow chart of a method according to an embodiment of the present invention.

FIG. 10 is a flow chart of method 1000 according to an embodiment of the invention.

Method 1000 starts by stage 1010 of placing an object beneath a bridge that is configured to accommodate in a precise manner a jet print head.

Stage 1010 is followed by stages 1020 and 1030. These stages may be executed in parallel, in a partially overlapping manner, in an alternating manner or in a sequential manner.

Stage 1020 includes injecting, by first jet nozzles of the jet print head, a first type jettable substance to form a first pattern onto the surface of the object. The first type jettable substance may be utilized for printing a solder mask pattern. Stage 1020 may be followed by curing (or drying) stage 1025. Stage 1020 may include moving the object and, additionally or alternatively the first jet nozzles in order to achieve a desired pattern.

Stage 1030 includes injecting, by second jet nozzles of the jet print head, a second type jettable substance to form a second pattern onto the surface of the object. The second type jettable substance may be utilized for printing a legend pattern.

Stage 1030 may be followed by curing (or drying) stage 1035. Stage 1020 may include moving the object and, additionally or alternatively the first jet nozzles in order to achieve a desired pattern.

Method 1000 can be executed by any of the above first portions or systems.

Figure 11:
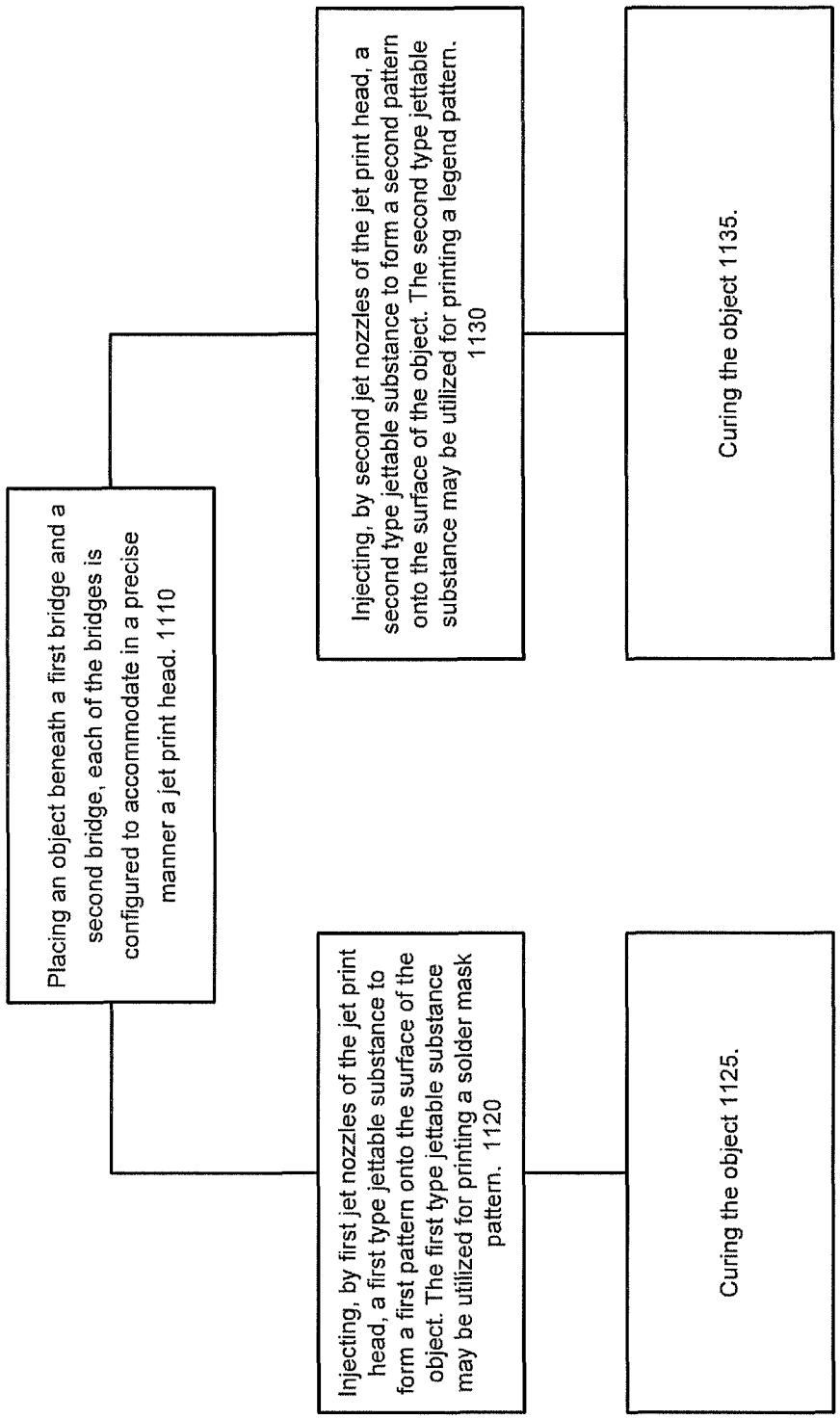
FIG. 11 is a flow chart of a method according to an embodiment of the present invention.

FIG. 11 is a flow chart of method 1100 according to an embodiment of the invention.

Method 1100 starts by stage 1110 of placing an object beneath a first bridge and a second bridge, each of the bridges is configured to accommodate in a precise manner a jet print head.

Stage 1110 is followed by stages 1120 and 1130. These stages may be executed in parallel, in a partially overlapping manner, in an alternating manner or in a sequential manner.

Stage 1120 includes injecting, by first jet nozzles of the jet print head, a first type jettable substance to form a first pattern onto the surface of the object. The first type jettable substance may be utilized for printing a solder mask pattern. Stage 1120 may be followed by curing (or drying) stage 1125. Stage 1120 may include moving the object and, additionally or alternatively the first jet nozzles in order to achieve a desired pattern. Stage 1120 may be executed by a first jet print head that is coupled to the first bridge.

Stage 1130 includes injecting, by second jet nozzles of the jet print head, a second type jettable substance to form a second pattern onto the surface of the object. The second type jettable substance may be utilized for printing a legend pattern. Stage 1130 may be followed by curing (or drying) stage 1135. Stage 1120 may include moving the object and, additionally or alternatively the first jet nozzles in order to achieve a desired pattern. Stage 1120 may be executed by a second jet print head that is coupled to the second bridge.

The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

I claim:

1. A printing bridge configured to accommodate in a precise manner a jet print head;
    wherein the jet print head comprises:
        first jet nozzles for injecting a first type jettable substance to form a first pattern onto the surface of a object,
        second jet nozzles for injecting a second type of jettable substance to form a first pattern onto the surface of a object; and
        a jet print head motor for moving the jet print head along a longitudinal axis of the printing bridge and at a second direction that is normal to a first direction of movement of the object and to a longitudinal axis of the object, while maintaining the jet print head above the object;
    wherein the first type jettable substance is utilized for printing a solder mask pattern; and wherein the second type jettable substance is utilized for printing a legend pattern.

2. The printing bridge according to claim 1 wherein the first jet nozzles are spaced apart from the second jet nozzles.

3. The printing bridge according to claim 1 wherein the first jet nozzles and second jet nozzles are arranged in an interlaced manner.

4. The printing bridge according to claim 1, wherein the first and second jet nozzles are arranged in a single row.

5. The printing bridge according to claim 1 wherein a part of the first jet nozzles and a part of the second jet nozzles are utilized as back-up nozzles.

6. The printing bridge according to claim 1 configured to receive control signals that force the first jet nozzles and the second jet nozzles to print the first and second patterns simultaneously.

7. The printing bridge according to claim 1, wherein the first and second jet nozzles form a diamond shaped array.

8. The printing bridge according to claim 1, wherein the first and second jet nozzles form a circular array.

9. The printing bridge according to claim 1, wherein at least one first jet nozzle is arranged to inject the first type jettable substance at one point in time and is arranged to inject the second type jettible substance at a second point in time.

10. The printing bridge according to claim 9, wherein the system is arranged to perform an intermediate purging step of the at least one nozzle in order to change printing inks between solder mask printing and legend ink printing.

11. The printing bridge according to claim 9, wherein the system is arranged to perform an intermediate purging step of the first jet nozzles in order to change printing inks between solder mask printing and legend ink printing.

12. The printing bridge according to claim 1, wherein the first jet nozzles are arranged to inject the first type jettable substance at one point in time and are arranged to inject the second type jettible substance at a second point in time.

13. The printing bridge according to claim 1, wherein the printing bridge is normal to the first direction.

14. A printing bridge configured to accommodate in a precise manner a jet print head;
    wherein the jet print head comprises multiple jet nozzles that are arranged to inject solder mask printing at a first point in time and arranged to inject legend ink at a second point in time.

15. The printing bridge according to claim 13, wherein the system is arranged to perform an intermediate purging step of the multiple jet nozzles in order to change printing inks between solder mask printing and legend ink printing.

* * * * *